United States Patent
Yoon et al.

(10) Patent No.: US 10,886,234 B2
(45) Date of Patent: Jan. 5, 2021

(54) SEMICONDUCTOR DEVICE AND SEMICONDUCTOR PACKAGE COMPRISING THE SAME

(71) Applicant: SAMSUNG ELECTRONICS CO., LTD., Suwon-si (KR)

(72) Inventors: Jun Ho Yoon, Seoul (KR); Yoon Sung Kim, Seoul (KR); Yun Hee Kim, Cheonan-si (KR); Byung Moon Bae, Daegu (KR); Hyun Su Sim, Cheonan-si (KR); Jung Ho Choi, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/534,051

(22) Filed: Aug. 7, 2019

(65) Prior Publication Data

US 2020/0066650 A1 Feb. 27, 2020

(30) Foreign Application Priority Data

Aug. 24, 2018 (KR) .................. 10-2018-0098968

(51) Int. Cl.
*H01L 23/544* (2006.01)
*H01L 23/31* (2006.01)
(Continued)

(52) U.S. Cl.
CPC ............ *H01L 23/544* (2013.01); *H01L 21/78* (2013.01); *H01L 21/782* (2013.01);
(Continued)

(58) Field of Classification Search
CPC . H01L 23/544; H01L 23/562; H01L 23/3171; H01L 21/78; H01L 21/782; H01L 21/82; H01L 21/784
(Continued)

(56) References Cited

U.S. PATENT DOCUMENTS 5,733,690 A * 3/1998 Jeong .................. G03F 1/44
430/5
6,352,940 B1 * 3/2002 Seshan ............ H01L 21/76826
438/762
(Continued)

FOREIGN PATENT DOCUMENTS

KR 10-2003-0058309 A 7/2003
KR 20030058309 A * 7/2003 ........... H01L 21/027
(Continued)

OTHER PUBLICATIONS

Machine translation, Lee, Korean Pat. Pub. No. KR 2009-0035124, translation date: Sep. 10, 2020, Espacenet, all pages. (Year: 2020).*
(Continued)

*Primary Examiner* — Victoria K. Hall
(74) *Attorney, Agent, or Firm* — Sughrue Mion, PLLC

(57) ABSTRACT

A semiconductor device is provided. The semiconductor device includes: a substrate which includes a semiconductor chip region and a scribe line region surrounding the semiconductor chip region; an insulating film arranged over the semiconductor chip region and the scribe line region on the substrate, and including a first surface, a second surface opposite to the first surface, a third surface connecting the first surface and the second surface, and a fourth surface opposite to the third surface and connecting the first surface and the second surface; and an opening portion formed on the second surface of the insulating film and the fourth surface of the insulating film to expose the substrate, wherein the opening portion is formed in the scribe line region, and the first surface of the insulating film and the third surface of the insulating film do not include an opening portion which expose the substrate.

20 Claims, 15 Drawing Sheets

(51) Int. Cl.
    *H01L 23/00*     (2006.01)
    *H01L 21/78*     (2006.01)
    *H01L 21/782*     (2006.01)
    *H01L 21/784*     (2006.01)

(52) U.S. Cl.
    CPC ........ *H01L 21/784* (2013.01); *H01L 23/3171* (2013.01); *H01L 23/562* (2013.01)

(58) Field of Classification Search
    USPC .......................................... 257/620; 438/462
    See application file for complete search history.

(56) References Cited

U.S. PATENT DOCUMENTS

| | | | | |
|---|---|---|---|---|
| 6,614,120 | B2* | 9/2003 | Sato | H01L 23/528 257/208 |
| 7,223,673 | B2* | 5/2007 | Wang | H01L 23/562 257/620 |
| 7,485,955 | B2* | 2/2009 | Kang | H01L 24/32 257/701 |
| 7,785,990 | B2* | 8/2010 | Kim | H01L 21/78 438/462 |
| 7,939,913 | B2* | 5/2011 | Watanabe | H01L 23/3192 257/620 |
| 8,241,999 | B2* | 8/2012 | Ikeda | H01L 23/585 438/462 |
| 8,956,955 | B2* | 2/2015 | Kogawa | H01L 21/304 438/462 |
| 9,355,970 | B2* | 5/2016 | Huang | H01L 24/05 |
| 9,559,005 | B2 | 1/2017 | Tsai et al. | |
| 9,601,460 | B2* | 3/2017 | Ho | H01L 23/3114 |
| 9,748,181 | B1 | 8/2017 | Jackson et al. | |
| 2004/0140052 | A1 | 7/2004 | Han | |
| 2005/0127512 | A1* | 6/2005 | Yamagata | H01L 24/13 257/758 |
| 2006/0163701 | A1* | 7/2006 | Ahn | H01L 23/562 257/620 |
| 2007/0057349 | A1* | 3/2007 | Yang | H01L 23/544 257/620 |
| 2007/0195255 | A1* | 8/2007 | Cho | G02F 1/133351 349/153 |
| 2007/0246821 | A1 | 10/2007 | Lu et al. | |
| 2008/0048299 | A1* | 2/2008 | Hedler | H01L 23/481 257/623 |
| 2011/0304007 | A1* | 12/2011 | Watanabe | H01L 21/78 257/506 |
| 2012/0021600 | A1 | 1/2012 | Han et al. | |
| 2014/0015112 | A1* | 1/2014 | Watanabe | H01L 23/00 257/620 |
| 2014/0239455 | A1* | 8/2014 | Ishii | H01L 23/564 257/620 |
| 2014/0264767 | A1* | 9/2014 | Gratz | H01L 23/585 257/620 |
| 2015/0228536 | A1* | 8/2015 | Ho | H01L 23/3114 257/773 |
| 2015/0279728 | A1* | 10/2015 | Topacio | H01L 24/11 257/632 |
| 2015/0364376 | A1* | 12/2015 | Yu | H01L 24/11 257/620 |
| 2016/0086896 | A1* | 3/2016 | Huang | H01L 21/283 438/113 |
| 2016/0172311 | A1* | 6/2016 | Pagani | H01L 21/76224 324/762.01 |
| 2018/0240832 | A1 | 8/2018 | Iwafuchi | |
| 2020/0051932 | A1* | 2/2020 | Han | H01L 24/16 |
| 2020/0126927 | A1* | 4/2020 | Kim | H01L 23/291 |

FOREIGN PATENT DOCUMENTS

| | | | | |
|---|---|---|---|---|
| KR | 10-2009-0035124 A | * | 4/2009 | ............ H01L 21/78 |
| KR | 10-2009-0035124 A | | 4/2009 | |
| KR | 10-2017-0122176 A | | 11/2017 | |

OTHER PUBLICATIONS

Machine translation, Lee, Korean Pat. Pub. No. KR 2003-0058309, translation date: Sep. 10, 2020, Espacenet, all pages. (Year: 2020).*

* cited by examiner

SEMICONDUCTOR DEVICE AND SEMICONDUCTOR PACKAGE COMPRISING THE SAME

CROSS-REFERENCE TO THE RELATED APPLICATION

This application claims priority from Korean Patent Application No. 10-2018-0098968, filed on Aug. 24, 2018, the disclosure of which is incorporated herein by reference in its entirety.

BACKGROUND

1. Field

Apparatuses and methods consistent with the exemplary embodiments of the inventive concept relates to a semiconductor device and a semiconductor package including the same.

2. Description of the Related Art

Recently, semiconductor devices have been miniaturized and performances have been improved. As a result, a low dielectric constant insulating film may be used for the semiconductor devices.

In the case of cutting a semiconductor device for packaging, physical stress may be applied to the semiconductor device. To prevent such physical stress, a low dielectric constant insulating film may be used for the semiconductor device. However, when the low dielectric constant insulating film is used, a peeling phenomenon of a wiring arranged under the low dielectric constant insulating film may occur.

SUMMARY

Exemplary embodiments of the inventive concept provide a semiconductor device manufacture by an improved method which forms an opening portion only on a limited number of side surfaces of the semiconductor device on a substrate.

However, the inventive concept is not restricted to the embodiments set forth herein. Various other embodiments of the inventive concept will become apparent to one of ordinary skill in the art to which the inventive concept pertains by referencing the detailed description given below.

According to some exemplary embodiments, there is provided a semiconductor device which may include: a substrate which includes a semiconductor chip region and a scribe line region surrounding the semiconductor chip region; an insulating film arranged over the semiconductor chip region and the scribe line region on the substrate, and including a first surface, a second surface opposite to the first surface, a third surface connecting the first surface and the second surface, and a fourth surface opposite to the third surface and connecting the first surface and the second surface; and an opening portion formed on the second surface of the insulating film and the fourth surface of the insulating film to expose the substrate, wherein the opening portion is formed in the scribe line region, and the first surface of the insulating film and the third surface of the insulating film do not include an opening portion which expose the substrate.

According to some exemplary embodiments, there is provided a semiconductor device which may include: a substrate which includes a semiconductor chip region and a scribe line region surrounding the semiconductor chip region; an insulating film arranged over the semiconductor chip region and the scribe line region on the substrate, and including a first surface, a second surface opposite to the first surface, a third surface connecting the first surface and the second surface, and a fourth surface opposing to the third surface and connecting the first surface and the second surface; and a passivation film arranged on the insulating film and arranged over the semiconductor chip region and the scribe line region, wherein the first surface of the insulating film is defined by: a first portion of the insulating film located in the scribe line region, protruding from the passivation film and having a first width; and a second portion of the insulating film located in the scribe line region, protruding from the passivation film and having a second width smaller than the first width, and the second surface of the insulating film is defined by a third portion of the insulating film located in the scribe line region, protruding from the passivation film and having a third width smaller than the first width.

According to some embodiments of the inventive concept, there is provided a semiconductor package which may include: a substrate having four side surfaces; a semiconductor chip formed on an upper surface of the substrate; and an insulating film encompassing the semiconductor chip and having four side surfaces, wherein, in a plan view of the semiconductor device, only two of the four side surfaces of the insulating film expose the upper surface of the substrate, and the other two of the four side surfaces of the insulating film are connected to two of the four side surfaces of the substrate, respectively, on a same plane.

BRIEF DESCRIPTION OF THE DRAWINGS

The above and other aspects and features of the inventive concept will become apparent by describing in detail exemplary embodiments thereof with reference to the attached drawings, in which.

DETAILED DESCRIPTION OF THE EXEMPLARY EMBODIMENTS

The embodiments presented herein are all exemplary which do not restrict the inventive concept. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Hereinafter, a semiconductor device according to some embodiments will be described with reference to FIGS. 1 to 7.

Figure 1:
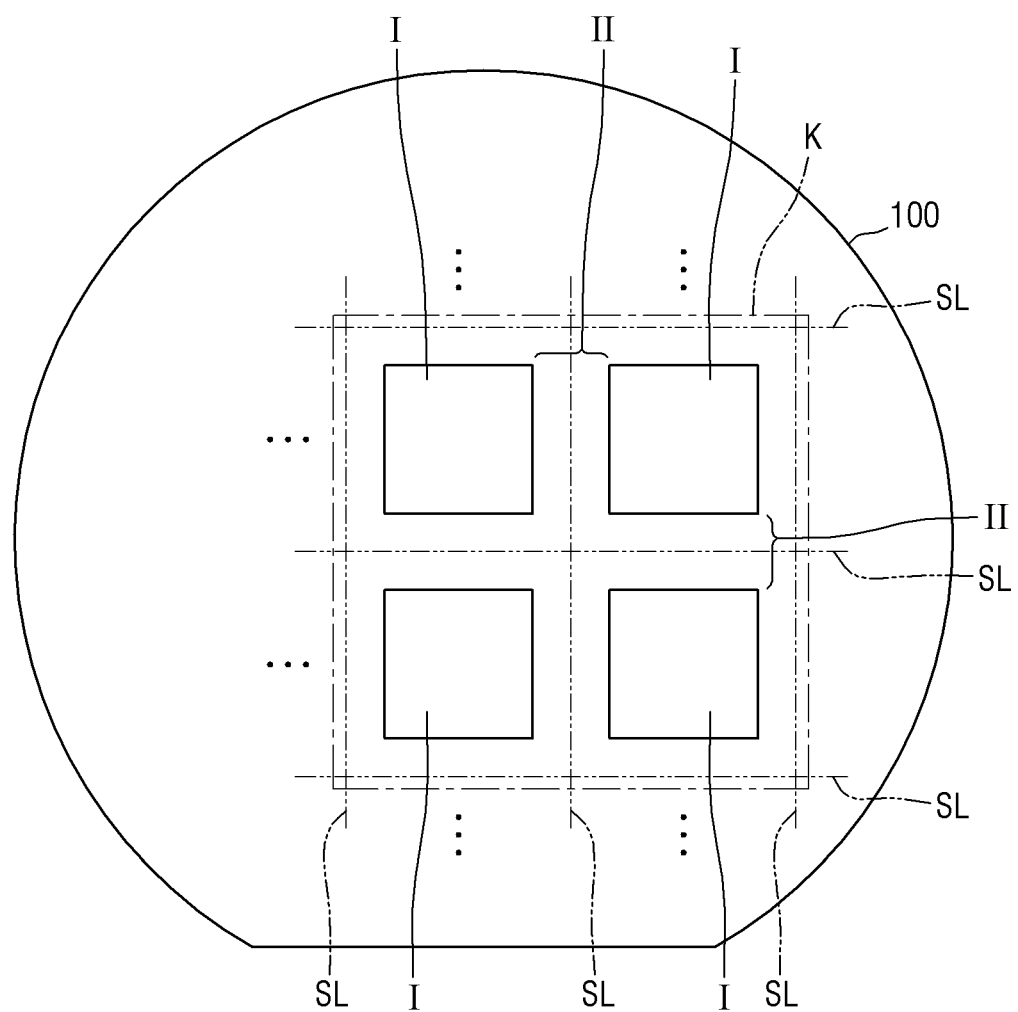
FIG. 1 is a diagram illustrating a substrate on which semiconductor devices according to some embodiments are integrated before the substrate is cut.
Figure 2:
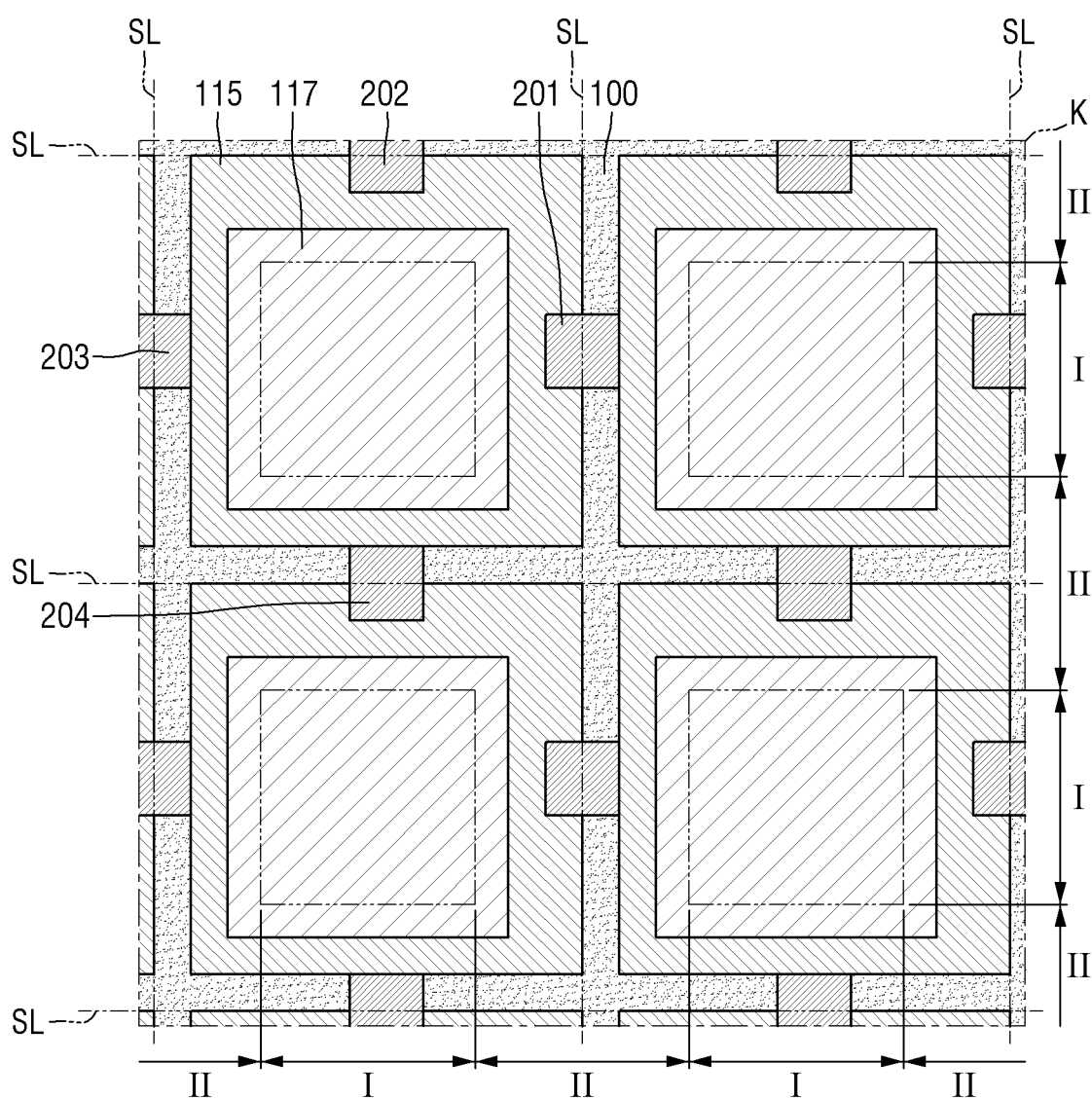
FIG. 2 is an enlarged view of a region K of FIG. 1.

FIG. 1 is a diagram illustrating a substrate 100 on which semiconductor devices (1100 of FIG. 3) according to some embodiments are integrated, before the substrate 100 is cut. FIG. 2 is an enlarged view of a region K of FIG. 1. In FIG. 2, for the purpose of clarity of description, a cutting line SL, the substrate 100, a third insulating film 115, a first alignment key 201, a second alignment key 202, a third alignment key 203, a fourth alignment key 204 and a passivation film 117 are illustrated.

Referring to FIGS. 1 and 2, the substrate 100 of the semiconductor device according to some embodiments may include a semiconductor chip region I and a scribe line region II.

A plurality of semiconductor chip regions I may be arranged on the substrate 100. Each of the semiconductor chip regions I may be spaced apart from each other by the scribe line region II. The semiconductor chip regions I may include, for example, a semiconductor chip wiring (105 of FIG. 4), a lower wiring structure (121 of FIG. 4), an upper wiring structure (122 of FIG. 4) and a rewiring layer (123 of FIG. 4).

The scribe line region II may be a region located to surround the semiconductor chip region I. For example, the scribe line region II may be a region located along the periphery of the semiconductor chip region I. The scribe line region II may include the cutting line SL. The cutting line SL may be a line for cutting the substrate 100 in order to fabricate a semiconductor device 1100 to be described with reference to FIG. 3 in a subsequent process.

The third insulating film 115 and the passivation film 117 may be arranged over the semiconductor chip region I and the scribe line region II of the substrate 100. Details thereof will be described later with reference to FIGS. 4 to 7.

The first alignment key 201, the second alignment key 202, the third alignment key 203 and the fourth alignment key 204 may be arranged in the scribe line region II. The first alignment key 201, the second alignment key 202, the third alignment key 203 and the fourth alignment key 204 may be arranged between the adjacent semiconductor chip regions I.

The cutting line SL may pass through the first alignment key 201, the second alignment key 202, the third alignment key 203 and the fourth alignment key 204. Therefore, when the substrate 100 is cut along the cutting line SL to form the semiconductor device (1100 of FIG. 3) in the subsequent process, each of the first alignment key 201, the second alignment key 202, the third alignment key 203, and the fourth alignment key 204 may be halved. The semiconductor device (1100 of FIG. 3) formed by cutting the substrate 100 along the cutting line SL may include a part of the scribe line region II and the semiconductor chip region I.

Figure 3:
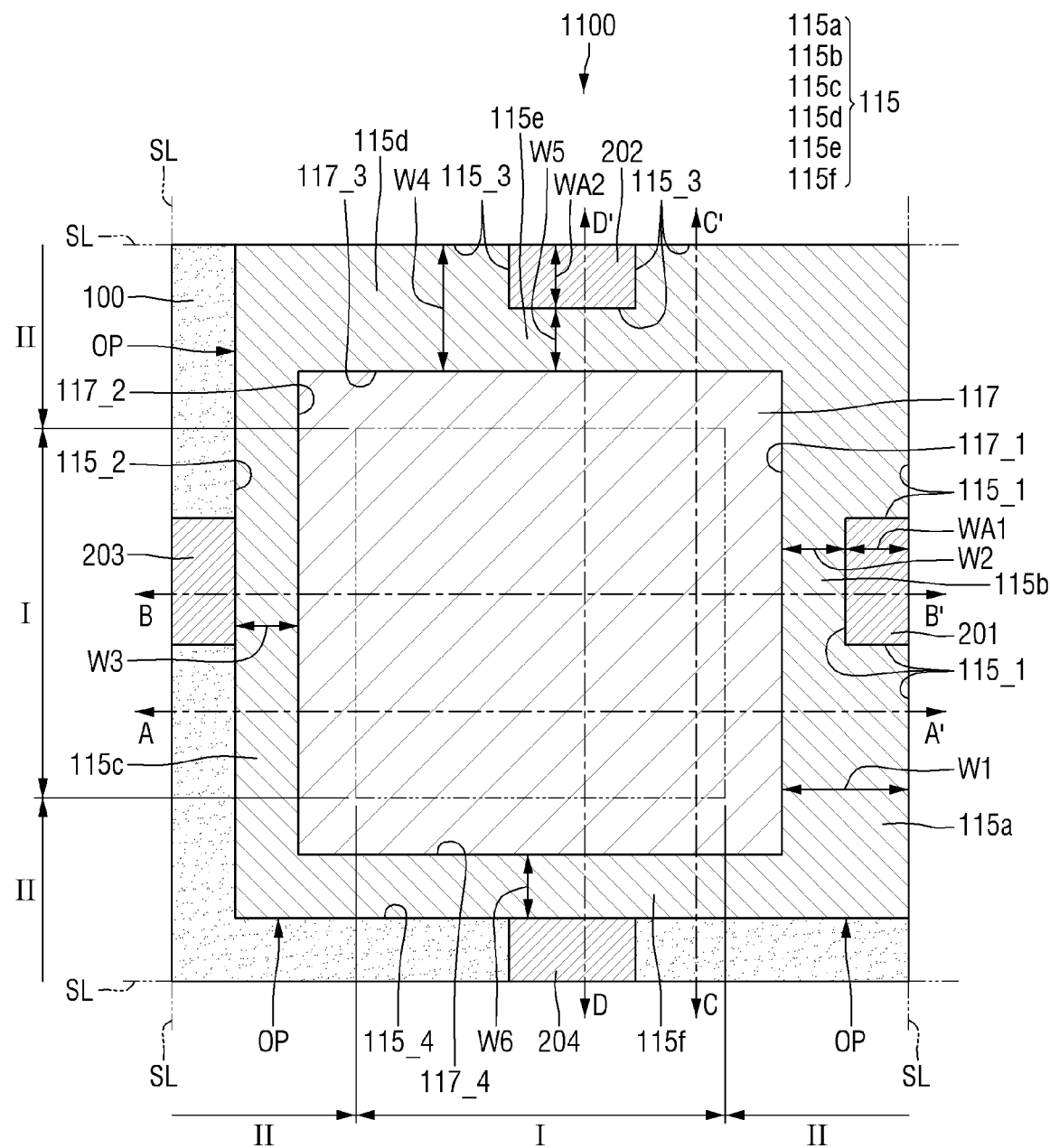
FIG. 3 is a diagram illustrating a semiconductor device according to some embodiments.
Figure 4:
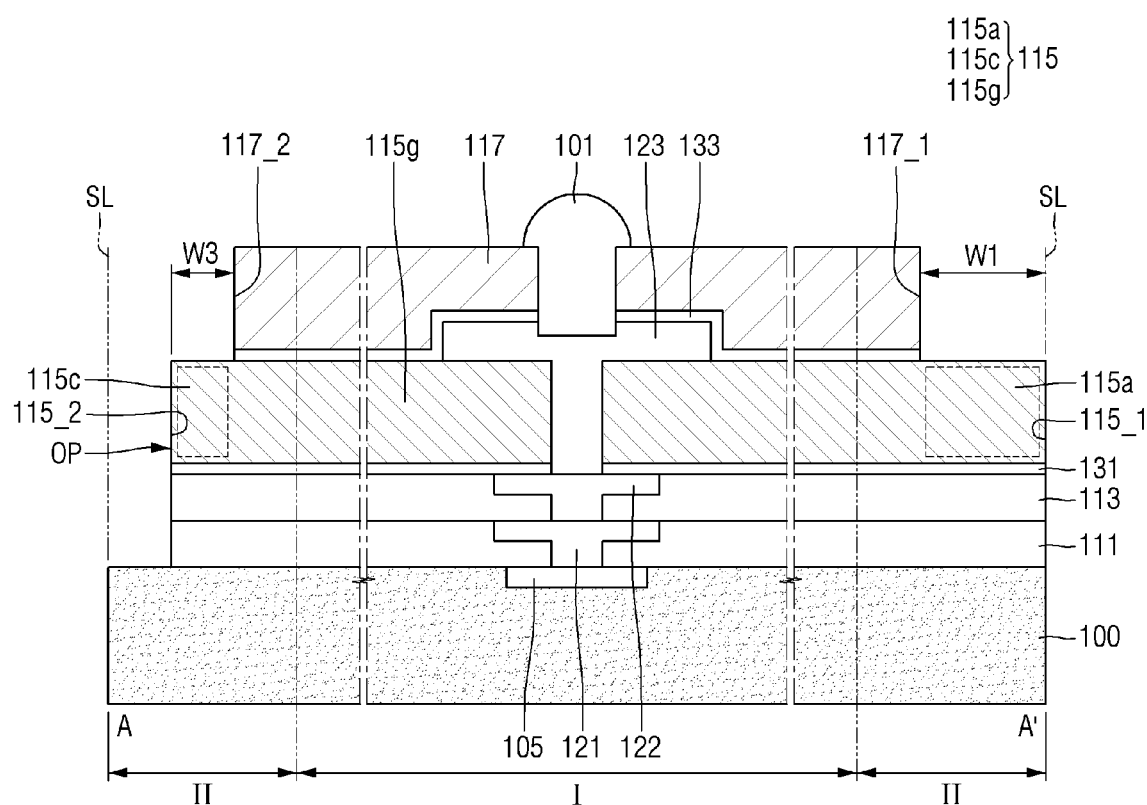
FIG. 4 is a cross-sectional view taken along line A-A' of FIG. 3.
Figure 5:
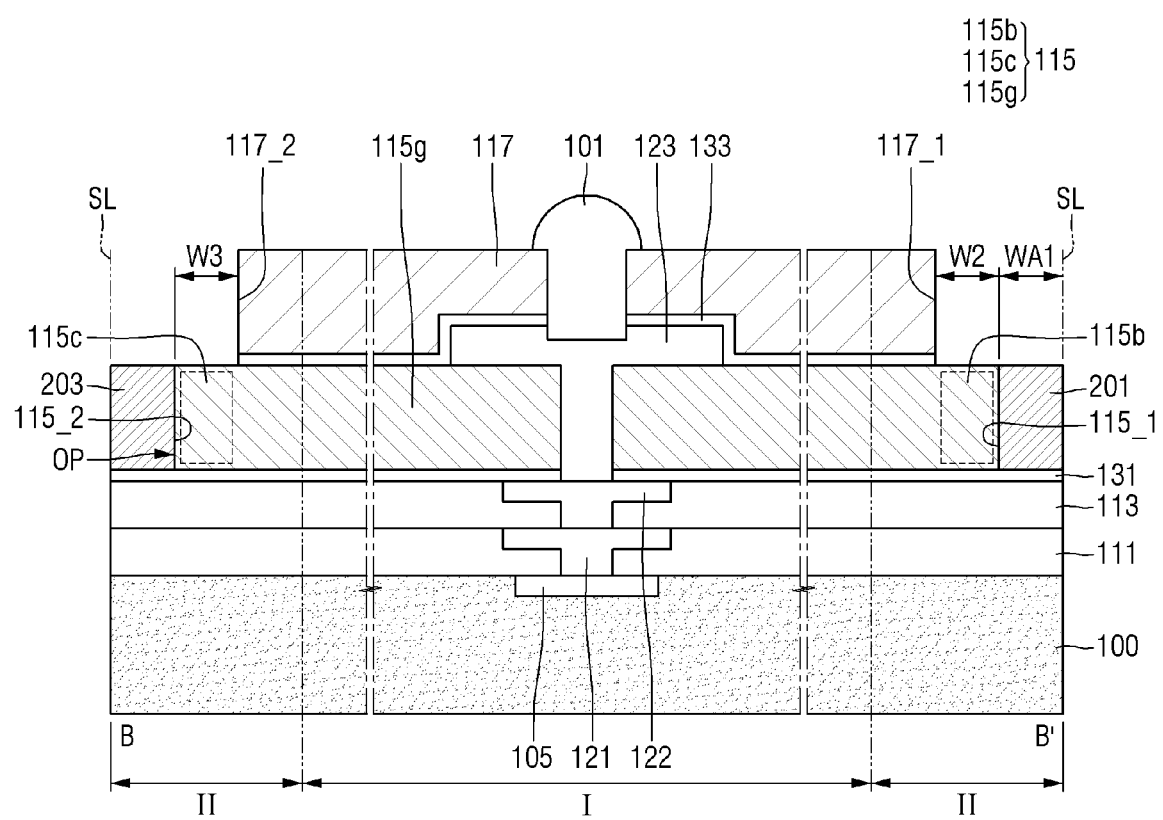
FIG. 5 is a cross-sectional view taken along line B-B' of FIG. 3.
Figure 6:
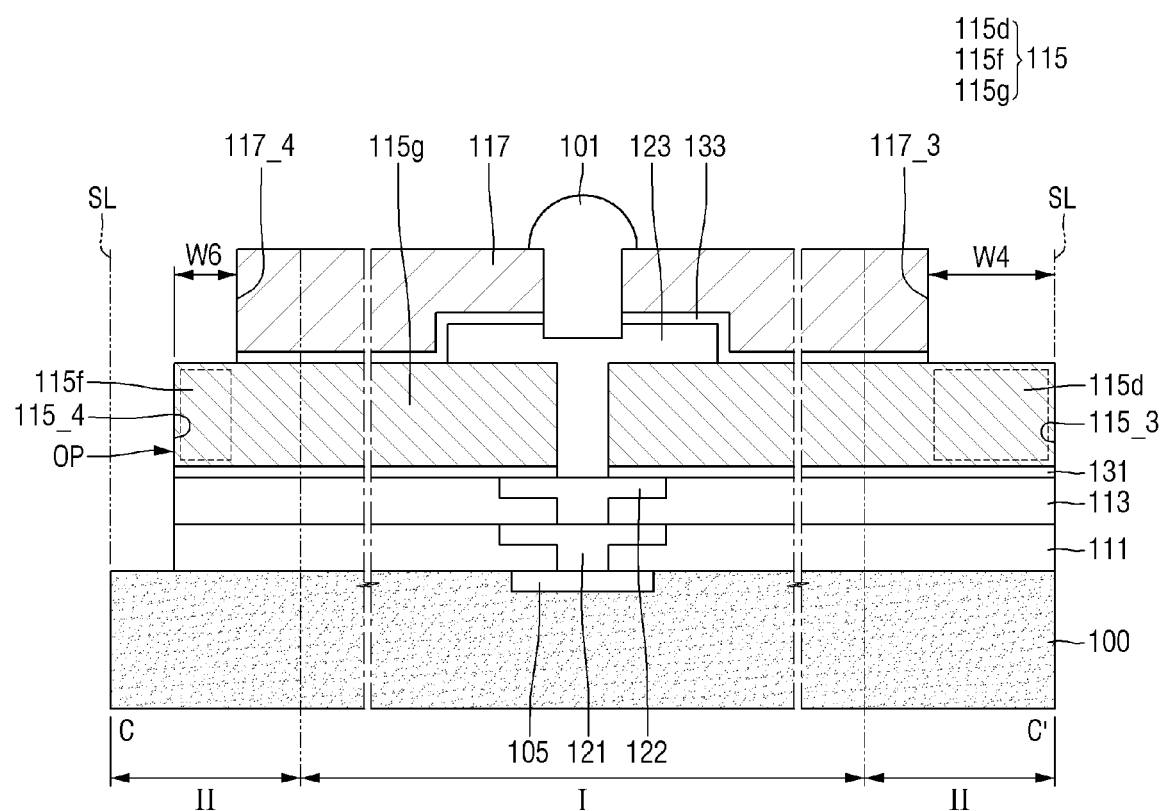
FIG. 6 is a cross-sectional view taken along the line C-C' of FIG. 3.
Figure 7:
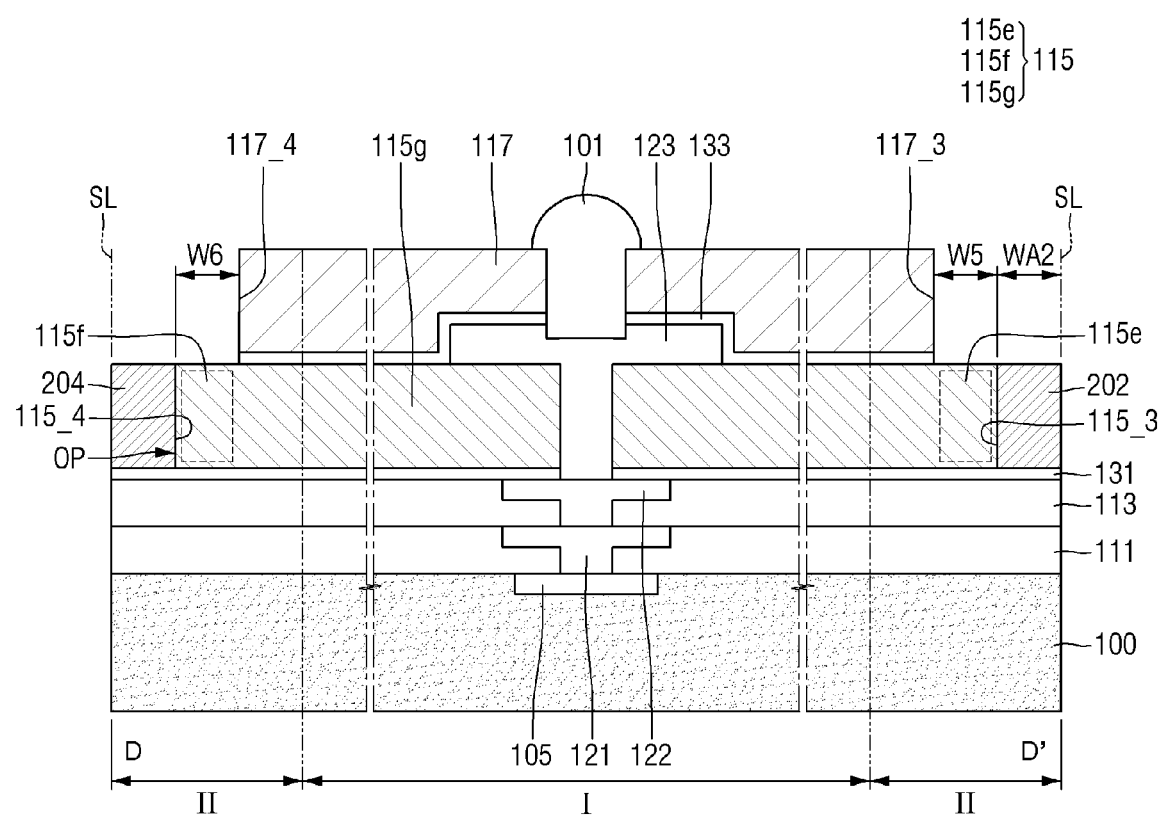
FIG. 7 is a cross-sectional view taken along line D-D' of FIG. 3.

FIG. 3 is a diagram illustrating a semiconductor device according to some embodiments. FIG. 3 illustrates the semiconductor device 1100 formed after the substrate 100 of FIGS. 1 and 2 is cut along the cutting line SL. In FIG. 3, for the clarity of description, only the substrate 100, the third insulating film 115, the passivation film 117, the first alignment key 201, the second alignment key 202, the third alignment key 203 and the fourth alignment key 204 are illustrated. FIG. 4 is a cross-sectional view taken along line A-A' of FIG. 3. FIG. 5 is a cross-sectional view taken along line B-B' of FIG. 3. FIG. 6 is a cross-sectional view taken along the line C-C' of FIG. 3. FIG. 7 is a cross-sectional view taken along line D-D' of FIG. 3.

Referring to FIGS. 3 to 7, the semiconductor device 1100 according to some embodiments may include a part of the scribe line region II of the substrate 100 and the semiconductor chip region I.

The semiconductor chip region I may include a semiconductor chip. The semiconductor chip may include, for example, a semiconductor chip wiring 105, a lower wiring structure 121, an upper wiring structure 122 and a rewiring layer 123.

The semiconductor chip may be, for example, a memory chip, a logic chip, or the like. In a case where the semiconductor chip is a logic chip, various designs may be made in consideration of operations to be executed and the like. In a case where the semiconductor chip is a memory chip, the memory chip may be, for example, a non-volatile memory chip. Specifically, the memory chip may be a flash memory chip. More specifically, the memory chip may be one of a NAND flash memory chip or a NOR flash memory chip. On the other hand, the form of the memory device according to the inventive concept is not limited thereto. In some embodiments, the memory chip may include one of a PRAM (Phase-change Random-Access Memory), an MRAM (Magneto-resistive Random-Access Memory), and a RRAM (Resistive Random-Access Memory).

The substrate 100 may have a structure in which a base substrate and an epitaxial layer are stacked, but the inventive concept is not limited thereto. The substrate 100 may be a silicon substrate, a gallium arsenide substrate, a silicon germanium substrate, a ceramic substrate, a quartz substrate, a glass substrate for a display, and the like, and may be an SOI (Semiconductor On Insulator) substrate. Hereinafter, the silicon substrate will be exemplified as an example. Further, the substrate 100 may have a form in which an insulating film is formed on a silicon substrate.

The substrate 100 may include a semiconductor chip wiring 105. The semiconductor chip wiring 105 may be arranged, for example, in the semiconductor chip region I. In the semiconductor device according to some embodiments, it is assumed that the semiconductor chip wiring 105 is a metal wiring, but this is merely for convenience of explanation, and the embodiment is not limited thereto. It is a matter of course that the semiconductor chip wiring 105 may be a transistor, a diode, or the like formed in the substrate 100, and may be, for example, a gate electrode of the transistor or a source/drain of the transistor.

The first insulating film 111 may be arranged on the substrate 100. The first insulating film 111 may be arranged over the semiconductor chip region I and the scribe line region II.

The first insulating film 111 may be a low dielectric material having a dielectric constant lower than that of the silicon oxide film. The first insulating film 111 may have a dielectric constant of about 1.0 to 3.0, and may include at least one of organic, inorganic, and organic-inorganic hybrid materials. In addition, the first insulating film 111 may be porous or non-porous. The first insulating film 111 may be formed of, for example, an impurity-doped silicon oxide film-based material or an organic polymer having a low dielectric constant (Low-k).

For example, the impurity-doped oxide film-based material may be, for example, a fluorine-doped oxide film (or FSG), a carbon-doped oxide film, a silicone oxide film, HSQ (hydrogen silsesquioxane; SiO:H), MSQ (methyl silsesquioxane; SiO:CH3) or a-SiOC(SiOC:H) or the like. The organic polymer having a low dielectric constant may be, for example, polyallyl ether-based resin, cyclic fluororesin, siloxane copolymer, fluorinated polyallyl ether-based resin, polypentafluorostyrene, polytetrafluorostyrene-based resin, fluorine polyimide resin, fluorinated polynaphthalene fluoride, polycide resin, and the like.

In the drawings, the first insulating film 111 is illustrated as a single film, but the inventive concept is not limited thereto. For example, the first insulating film 111 may include vertically stacked insulating films, and a barrier film arranged between each of the vertically stacked insulating films. The barrier film may include, for example, an insulating material such as SiN, SiON, SiC, SiCN, SiOCH film, SiOC, and SiOF.

The lower wiring structure 121 may be arranged in the first insulating film 111. The lower wiring structure 121 may be arranged in the semiconductor chip region I.

The lower wiring structure 121 may be electrically connected to the semiconductor chip wiring 105. The lower wiring structure 121 may include a lower wiring and a lower via. The lower via of the lower wiring structure 121 may be interposed between the lower wiring and the semiconductor chip wiring 105. In the drawings, the side wall of the lower via is illustrated as having a vertical inclination, but the inventive concept is not limited thereto. For example, the side wall of the lower via may of course extend from the semiconductor chip wiring 105 to the lower wiring at an arbitrary inclination.

The lower wiring structure 121 may include a conductive material.

The second insulating film 113 may be arranged on the first insulating film 111. The second insulating film 113 may be arranged over the semiconductor chip region I and the scribe line region II.

The second insulating film 113 may be, for example, high density plasma (HDP) oxide film.

The upper wiring structure 122 may be arranged in the second insulating film 113. The upper wiring structure 122 may be arranged in the semiconductor chip region I.

The upper wiring structure 122 may electrically connect the rewiring layer 123 and the lower wiring structure 121. The upper wiring structure 122 may include an upper wiring and an upper via. The upper via of the upper wiring structure 122 may be interposed between the upper wiring and the lower wiring structure 121. In the drawings, the side wall of the upper via is illustrated as having a vertical inclination, but the inventive concept is not limited thereto. For example, the side wall of the upper via may of course extend from the lower wiring structure 121 to the upper wiring at an arbitrary inclination.

The upper wiring structure 122 may include a conductive material.

An insertion film 131 may be arranged on the second insulating film 113. The insertion film 131 may be arranged over the semiconductor chip region I and the scribe line region II. The insertion film 131 may expose at least a part of the upper wiring structure 122.

The insertion film 131 may include an insulating material having etching selectivity with respect to the second insulating film 113 and the third insulating film 115. The insertion film 131 may be, for example, a silicon nitride film or a silicon oxynitride film.

The third insulating film 115 may be arranged on the insertion film 131. The third insulating film 115 may be arranged over the semiconductor chip region I and the scribe line region II. The third insulating film 115 may expose at least a part of the upper wiring structure 122.

The third insulating film 115 may include a first surface 115_1, a second surface 115_2, a third surface 115_3 and a fourth surface 115_4. The first surface 115_1 of the third insulating film 115 and the second surface 115_2 of the third insulating film 115 may be opposite to each other. The third surface 115_3 of the third insulating film 115 may connect the first surface 115_1 of the third insulating film 115 and the second surface 115_2 of the third insulating film 115. The fourth surface 115_4 of the third insulating film 115 may be opposite to the third surface 115_3 of the third insulating film 115, and may connect the first surface 115_1 of the third insulating film 115 and the second surface 115_2 of the third insulating film 115.

For example, when the first surface 115_1 of the third insulating film 115 and the second surface 115_2 of the third insulating film 115 extend in a first direction, the third surface 115_3 of the third insulating film 115 and the fourth surface 115_4 of the third insulating film 115 may extend in the second direction. Here, the second direction may be a direction intersecting the first direction.

Each of a part of the first surface 115_1 and a part of the third surface 115_3 of the third insulating film 115 may coincide with the cutting line SL. Each of the second surface 115_2 and the fourth surface 115_4 of the third insulating film 115 may be spaced apart from the cutting line SL.

Each of the first surface 115_1, the second surface 115_2, the third surface 115_3 and the fourth surface 115_4 of the third insulating film 115 may be located in the scribe line region II.

The third insulating film 115 may include a first portion 115a, a second portion 115b, a third portion 115c, a fourth portion 115d, a fifth portion 115e, a sixth portion 115f and a seventh portion 115g.

The first surface 115_1 of the third insulating film 115 may be defined by the first portion 115a of the third insulating film 115 and the second portion 115b of the third insulating film 115.

The first portion 115a of the third insulating film 115 may be located in the scribe line region II. The first portion 115a of the third insulating film 115 may protrude from the passivation film 117. For example, the first portion 115a of the third insulating film 115 may protrude from the first distal end 117_1 of the passivation film 117. The first portion 115a of the third insulating film 115 may be a portion that does not overlap the passivation film 117 in the vertical direction. Here, the vertical direction may be a direction perpendicular to the upper surface of the substrate 100. The first portion 115a of the third insulating film 115 may be exposed by the passivation film 117.

The first portion 115a of the third insulating film 115 may have a first width W1. The first width W1 may be, for example, a distance between the first distal end 117_1 of the passivation film 117 and the first surface 115_1 of the third insulating film 115.

The second portion 115b of the third insulating film 115 may be located in the scribe line region II. The second portion 115b of the third insulating film 115 may protrude from the passivation film 117. For example, the second portion 115b of the third insulating film 115 may protrude from the first distal end 117_1 of the passivation film 117. The second portion 115b of the third insulating film 115 may be a portion that does not overlap the passivation film 117 in the vertical direction. The second portion 115b of the third insulating film 115 may be exposed by the passivation film 117.

The second portion 115b of the third insulating film 115 may have a second width W2. The second width W2 may be, for example, a distance between the first distal end 117_1 of the passivation film 117 and the first surface 115_1 of the third insulating film 115.

The second surface 115_2 of the third insulating film 115 may be defined by the third portion 115c of the third insulating film 115.

The third portion 115c of the third insulating film 115 may be located in the scribe line region II. The third portion 115c of the third insulating film 115 may protrude from the passivation film 117. For example, the third portion 115c of the third insulating film 115 may protrude from the second distal end 117_2 of the passivation film 117. The third portion 115c of the third insulating film 115 may be a portion that does not overlap the passivation film 117 in the vertical direction. The third portion 115c of the third insulating film 115 may be exposed by the passivation film 117.

The third portion 115c of the third insulating film 115 may have a third width W3. The third width W3 may be, for example, a distance between the second distal end 117_2 of the passivation film 117 and the second surface 115_2 of the third insulating film 115.

The third surface 115_3 of the third insulating film 115 may be defined by the fourth portion 115d of the third insulating film 115 and the fifth portion 115e of the third insulating film 115.

The fourth portion 115d of the third insulating film 115 may be located in the scribe line region II. The fourth portion 115d of the third insulating film 115 may protrude from the passivation film 117. For example, the fourth portion 115d of the third insulating film 115 may protrude from the third distal end 117_3 of the passivation film 117. The fourth portion 115d of the third insulating film 115 may be a portion that does not overlap the passivation film 117 in the vertical direction. The fourth portion 115d of the third insulating film 115 may be exposed by the passivation film 117.

The fourth portion 115d of the third insulating film 115 may have a fourth width W4. The fourth width W4 may be, for example, a distance between the third distal end 117_3 of the passivation film 117 and the third surface 115_3 of the third insulating film 115.

The fifth portion 115e of the third insulating film 115 may be located in the scribe line region II. The fifth portion 115e of the third insulating film 115 may protrude from the passivation film 117. For example, the fifth portion 115e of the third insulating film 115 may protrude from the third distal end 117_3 of the passivation film 117. The fifth portion 115e of the third insulating film 115 may be a portion that does not overlap the passivation film 117 in the vertical direction. The fifth portion 115e of the third insulating film 115 may be exposed by the passivation film 117.

The fifth portion 115e of the third insulating film 115 may have a fifth width W5. The fifth width W5 may be, for example, a distance between the third distal end 117_3 of the passivation film 117 and the third surface 115_3 of the third insulating film 115.

The fourth surface 115_4 of the third insulating film 115 may be defined by the sixth portion 115f of the third insulating film 115.

The sixth portion 115f of the third insulating film 115 may be located in the scribe line region II. The sixth portion 115f of the third insulating film 115 may protrude from the passivation film 117. For example, the sixth portion 115f of the third insulating film 115 may protrude from the fourth distal end 117_4 of the passivation film 117. The sixth portion 115f of the third insulating film 115 may be a portion that does not overlap the passivation film 117 in the vertical direction. The sixth portion 115f of the third insulating film 115 may be exposed by the passivation film 117.

The sixth portion 115f of the third insulating film 115 may have a sixth width W6. The sixth width W6 may be, for example, a distance between the fourth distal end 117_4 of the passivation film 117 and the fourth surface 115_4 of the third insulating film 115.

The seventh portion 115g of the third insulating film 115 may be arranged over the semiconductor chip region I and the scribe line region II. The seventh portion 115g of the third insulating film 115 may be a portion that vertically overlaps the passivation film 117.

The first width W1 may be larger than the second width W2. The first width W1 may be greater than the third width W3. The second width W2 and the third width W3 may be the same as or different from each other.

The fourth width W4 may be greater than the fifth width W5. The fourth width W4 may be greater than the sixth width W6. The fifth width W5 and the sixth width W6 may be the same as or different from each other.

The first width W1 may be greater than the fifth width W5 and the sixth width W6. The fourth width W4 may be greater than the second width W2 and the third width W3. The first width W1 and the fourth width W4 may be the same as or different from each other.

The third insulating film 115 may include an insulating material different from that of the second insulating film 113. For example, the third insulating film 115 may include TEOS (TetraEthyl Ortho Silicate).

An opening portion OP may be formed in the scribe line region II. The opening portion OP may be formed on the second surface 115_2 and the fourth surface 115_4 of the third insulating film 115. The opening portion OP may expose the substrate 100. For example, the opening portion OP may expose an insulating material arranged in an uppermost surface of the substrate 100.

At least a part of the side wall of the opening portion OP may be defined by the second surface 115_2 of the third insulating film 115, the fourth surface 115_4 of the third insulating film 115, the insertion film 131, the second insulating film 113 and the first insulating film 111. A bottom surface of the opening portion OP may be defined by the substrate 100.

In the drawings, the side wall of the opening portion OP is illustrated as having an inclination perpendicular with respect to the substrate 100, but the inventive concept is not limited thereto. For example, the side wall of the opening portion OP may, of course, have an arbitrary inclination with respect to the substrate 100.

The opening portion OP may not be formed on the first surface 115_1 and the third surface 115_3 of the third insulating film 115. In other words, the substrate 100 may not be exposed on the first surface 115_1 and the third surface 115_3 sides of the third insulating film 115.

The first alignment key 201 may be arranged on the first surface 115_1 of the third insulating film 115. For example, the first alignment key 201 may be arranged side by side with the second portion 115b of the third insulating film 115. The first alignment key 201 may be arranged on the insertion film 131. The first alignment key 201 may be exposed by the passivation film 117. At least one surface of the first alignment key 201 may be surrounded by the first portion 115*a* and the second portion 115*b* of the third insulating film 115.

The sum of the second width W2 and the width WA1 of the first alignment key 201 may be substantially the same as the first width W1.

The first alignment key 201 may include first and second surfaces opposed to each other. The first surface of the first alignment key 201 may be closer to the second surface 115*b* of the third insulation film 115 than the second surface of the first alignment key 201. For example, the first surface of the first alignment key 201 may be in direct contact with the second portion 115*b* of the third insulating film 115.

A part of the first surface 115_1 of the third insulating film 115 and the second surface of the first alignment key 201 may coincide with the cutting line SL. Here, a part of the first surface 115_1 of the third insulating film 115 may be a portion in which the first portion 115*a* of the third insulating film 115 is defined.

The second alignment key 202 may be arranged on the third surface 115_3 of the third insulating film 115. For example, the second alignment key 202 may be arranged side by side with the fifth portion 115*e* of the third insulating film 115. The second alignment key 202 may be arranged on the insertion film 131. The second alignment key 202 may be exposed by the passivation film 117. At least one surface of the second alignment key 202 may be surrounded by the fourth portion 115*d* and the fifth portion 115*e* of the third insulating film 115.

The sum of the fifth width W5 and the width WA2 of the second alignment key 202 may be substantially the same as the fourth width W4.

The second alignment key 202 may include a first surface and a second surface opposite to each other. The first surface of the second alignment key 202 may be closer to the fifth portion 115*e* of the third insulating film 115 than the second surface of the second alignment key 202. For example, the first surface of the second alignment key 202 may be in direct contact with the fifth portion 115*e* of the third insulating film 115.

A part of the third surface 115_3 of the third insulating film 115 and the second surface of the second alignment key 202 may coincide with the cutting line SL. Here, a part of the third surface 115_3 of the third insulating film 115 may be a portion in which the fourth portion 115*d* of the third insulating film 115 is defined.

The third alignment key 203 may be arranged on the second surface 115_2 of the third insulating film 115. For example, the third alignment key 203 may be arranged side by side with the third portion 115*c* of the third insulating film 115. The third alignment key 203 may be arranged on the insertion film 131. The third alignment key 203 may be exposed by the passivation film 117.

The third alignment key 203 may include a first surface and a second surface facing each other. The first surface of the third alignment key 203 may be closer to the third portion 115*c* of the third insulation film 115 than the second surface of the third alignment key 203. For example, the first surface of the third alignment key 203 may be in direct contact with the third portion 115*c* of the third insulating film 115.

The second surface of the third alignment key 203 may coincide with the cutting line SL.

The fourth alignment key 204 may be arranged on the fourth surface 115_4 of the third insulating film 115. For example, the fourth alignment key 204 may be arranged side by side with the sixth portion 115*f* of the third insulating film 115. The fourth alignment key 204 may be arranged on the insertion film 131. The fourth alignment key 204 may be exposed by the passivation film 117.

The fourth alignment key 204 may include a first surface and a second surface facing each other. The first surface of the fourth alignment key 204 may be closer to the sixth portion 115*f* of the third insulation film 115 than the second surface of the fourth alignment key 204. For example, the first surface of the fourth alignment key 204 may be in direct contact with the sixth portion 115*f* of the third insulating film 115.

The second surface of the fourth alignment key 204 may coincide with the cutting line SL.

The rewiring layer 123 may be arranged in the semiconductor chip region I. A part of the rewiring layer 123 may extend into the seventh portion 115*g* of the third insulating film 115 and the insertion film 131. The remaining parts of the rewiring layer 123 may be arranged on the seventh portion 115*g* of the third insulating film 115. The rewiring layer 123 may be electrically connected to the upper wiring structure 122. The rewiring layer 123 may be arranged between the upper wiring structure 122 and the connection terminal 101.

In the drawing, it is assumed that the side wall of the portion of the rewiring layer 123 extending into the seventh portion 115*g* of the third insulating film 115 and the insertion film 131 have a vertical inclination, but the inventive concept is not limited thereto. For example, it is a matter of course that the side wall of the portion of the rewiring layer 123 extending into the seventh portion 115*g* of the third insulating film 115 and the insertion film 131 may extend from the upper wiring structure 122 to the passivation film 117 with an arbitrary inclination.

The rewiring layer 123 may include at least one metal or a metal alloy selected from a group including copper (Cu), aluminum (Al), nickel (Ni), silver (Ag), gold (Au), platinum (Pt), tin (Sn), lead (Pb), titanium (Ti), chromium (Cr), palladium (Pd), indium (in), zinc (Zn) and carbon (C).

A protective film 133 may be arranged over the semiconductor chip region I and the scribe line region II. The protective film 133 may be arranged on the seventh portion 115*g* of the third insulating film 115 and the rewiring layer 123. The protective film 133 may not extend, for example, to the first portion 115*a*, the second portion 115*b*, the third portion 115*c*, the fourth portion 115*d*, the fifth portion 115*e* and the sixth portion 115*f* of the third insulating film 115. For example, the protective film 133 may expose the first portion 115*a*, the second portion 115*b*, the third portion 115*c*, the fourth portion 115*d*, the fifth portion 115*e* and the sixth portion 115*f* of the third insulating film 115. The protective film 133 may expose a part of the rewiring layer 123.

The protective film 133 may be, for example, a silicon nitride film or a silicon oxynitride film.

The passivation film 117 may be arranged over the semiconductor chip region I and the scribe line region II. The passivation film 117 may be arranged on the protective film 133. The passivation film 117 may be arranged on the seventh portion 115*g* of the third insulating film 115. The passivation film 117 may not be arranged on the first portion 115*a*, the second portion 115*b*, the third portion 115*c*, the fourth portion 115*d*, the fifth portion 115*e* and the sixth portion 115*f* of the third insulating film 115.

For example, the passivation film 117 may not vertically overlap the first portion 115*a*, the second portion 115*b*, the third portion 115*c*, the fourth portion 115*d*, the fifth portion 115*e* and the sixth portion 115*f* of the third insulating film 115. The passivation film 117 may expose the first portion 115a, the second portion 115b, the third portion 115c, the fourth portion 115d, the fifth portion 115e and the sixth portion 115f of the third insulating film 115.

The passivation film 117 may include a first distal end 117_1, a second distal end 117_2, a third distal end 117_3 and a fourth distal end 117_4. The first distal end 117_1 and the second distal end 117_2 of the passivation film 117 may be opposite to each other. The third distal end 117_3 of the passivation film 117 may connect the first distal end 117_1 and the second distal end 117_2 to each other. The fourth distal end 117_4 of the passivation film 117 may be opposite to the third distal end 117_3, and connect the first distal end 117_1 and the second distal end 117_2.

The first distal end 117_1 of the passivation film 117 may be located, for example, at a boundary between the seventh portion 115g and the first portion 115a of the third insulating film 115. Further, the first distal end 117_1 of the passivation film 117 may be located, for example, at a boundary between the seventh portion 115g and the second portion 115b of the third insulating film 115.

The second distal end 117_2 of the passivation film 117 may be located, for example, at a boundary between the seventh portion 115g and the third portion 115c of the third insulating film 115.

The third distal end 117_3 of the passivation film 117 may be located, for example, at a boundary between the seventh portion 115g and the fourth portion 115d of the third insulating film 115. Also, the third distal end 117_3 of the passivation film 117 may be located, for example, at a boundary between the seventh portion 115g and the fifth portion 115e of the third insulating film 115.

The fourth distal end 117_4 of the passivation film 117 may be located, for example, at a boundary between the seventh portion 115g and the sixth portion 115f of the third insulating film 115.

In the drawings, the first distal end 117_1, the second distal end 117_2, the third distal end 117_3, and the fourth distal end 117_4 of the passivation film 117 are illustrated as having an inclination perpendicular from the upper surface of the third insulating film 115, but the inventive concept is not limited thereto. For example, the first distal end 117_1, the second distal end 117_2, the third distal end 117_3, and the fourth distal end 117_4 of the passivation film 117 may of course have an arbitrary inclination with respect to the upper surface of the third insulating film 115.

The passivation film 117 may include a polyimide-based material such as, for example, photosensitive polyimide (PSPI).

The connection terminal 101 may be arranged, for example, in the semiconductor chip region I. A part of the connection terminal 101 may penetrate the passivation film 117 and the protection film 133 and extend into the rewiring layer 123. For example, the connection terminal 101 may protrude from the upper surface of the passivation film 117.

The semiconductor chip wiring 105 may be electrically connected to the semiconductor package substrate (1200 of FIG. 8) through the connection terminal 101.

In the semiconductor device according to some embodiments, the opening portion OP is formed only on the second surface 115_2 and the fourth surface 115_4 of the third insulating film 115, and the opening portion OP is not formed on the first surface 115_1 and the third surface 115_3 of the insulating film 115. Thus, a portion on which the stress applied to the substrate 100 is concentrated in the cutting process of the substrate 100 can be made to coincide with the cutting line SL. For example, in order to form the semiconductor device 1100 by cutting the substrate 100, stress may be applied to the cutting line SL. At this time, for example, since the cutting line SL coincides with a part of the first surface 115_1 of the third insulating film 115 and the second surface of the first alignment key 201, and at least one surface of the alignment key 201 is surrounded by the first portion 115a and the second portion 115b of the third insulating film 115, a peeling phenomenon of the first alignment key 201 can be reduced. Therefore, the yield of the semiconductor device can be improved.

Hereinafter, the semiconductor package 1000 according to some embodiments will be described with reference to FIG. 8. For the sake of clarity of explanation, repeated description will be simplified or omitted.

Figure 8:
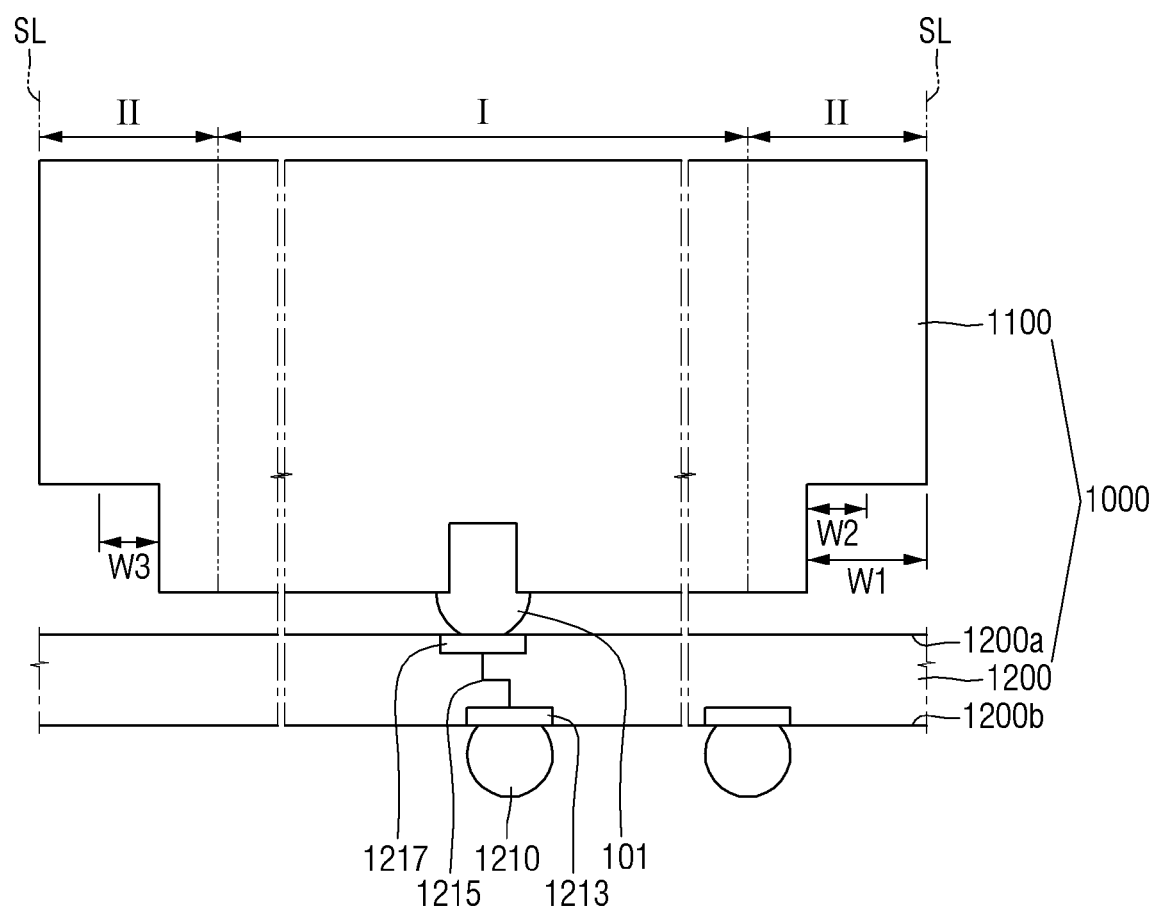
FIG. 8 is a diagram illustrating a semiconductor package according to some embodiments.

FIG. 8 is a diagram illustrating the semiconductor package 1000 according to some embodiments, after the semiconductor device (1100 of FIG. 3) formed after the substrate 100 of FIGS. 1 and 2 is taken along the cutting line SL is mounted on the semiconductor package substrate 1200. For the clarity of description, a molding material or the like is not illustrated in FIG. 8.

Referring to FIG. 8, the semiconductor package 1000 according to some embodiments may include a semiconductor package substrate 1200 and a semiconductor device 1100.

The semiconductor package substrate 1200 may be a package substrate, and may be, for example, a printed circuit board (PCB) or a ceramic substrate. The semiconductor package substrate 1200 may include a first surface 1200a and a second surface 1200b. The first surface 1200a and the second surface 1200b of the semiconductor package substrate 1200 may be opposite to each other. The semiconductor device 1100 may be mounted on the first surface 1200a of the semiconductor package substrate 1200. An external connection terminal 1210 may be attached to the second surface 1200b of the semiconductor package substrate 1200.

Here, the semiconductor device 1100 may be the semiconductor device 1100 described with reference to FIGS. 1 to 7. The semiconductor device 1100 may be mounted on the semiconductor package substrate 1200 in the form of, for example, a flip chip, but is not limited thereto. For example, the semiconductor device 1100 may of course be mounted on the semiconductor package substrate 1200 in an appropriate form as necessary.

The semiconductor package substrate 1200 and the semiconductor device 1100 may be electrically connected to each other via the connection terminal 101. The connection terminal 101 may be interposed between the first surface 1200a of the semiconductor package substrate 1200 and the semiconductor device 1100.

The external connection terminal 1210 may electrically connect the semiconductor package 1000 to the external device.

The connection terminal 101 and the external connection terminal 1210 may be a conductive ball or a solder ball, but the inventive concept is not limited thereto. The connection terminal 101 and the external connection terminal 1210 may be, for example, one of a conductive bump, a conductive spacer and a pin grid array (PGA).

The external connection terminal 1210 and the connection terminal 101 may be electrically connected to each other through the first pad 1213, the connection wiring 1215 and the second pad 1217.

The first pad 1213 may be arranged on the second surface 1200b of the semiconductor package substrate 1200. The second pad 1217 may be arranged on the first surface 1200a of the semiconductor package substrate 1200. Although the upper surface of the first pad 1213 is illustrated as being located on the same plane as the second surface 1200b of the semiconductor package substrate 1200, the inventive concept is not limited thereto. In addition, although the upper surface of the second pad 1217 is illustrated as being located on the same plane as the first surface 1200a of the semiconductor package substrate 1200, the inventive concept is not limited thereto. For example, at least a part of at least one of the first pad 1213 and the second pad 1217 may protrude from each surface of the semiconductor package substrate 1200.

The first pad 1213 and the second pad 1217 may be electrically connected to each other by the connection wiring 1215.

The first pad 1213, the second pad 1217 and the connection wiring 1215 may include a conductive material.

Hereinafter, a method of fabricating a semiconductor device according to some embodiments will be described with reference to FIGS. 9 to 15. For the sake of clarity of explanation, repeated description will be simplified or omitted.

Figure 9:
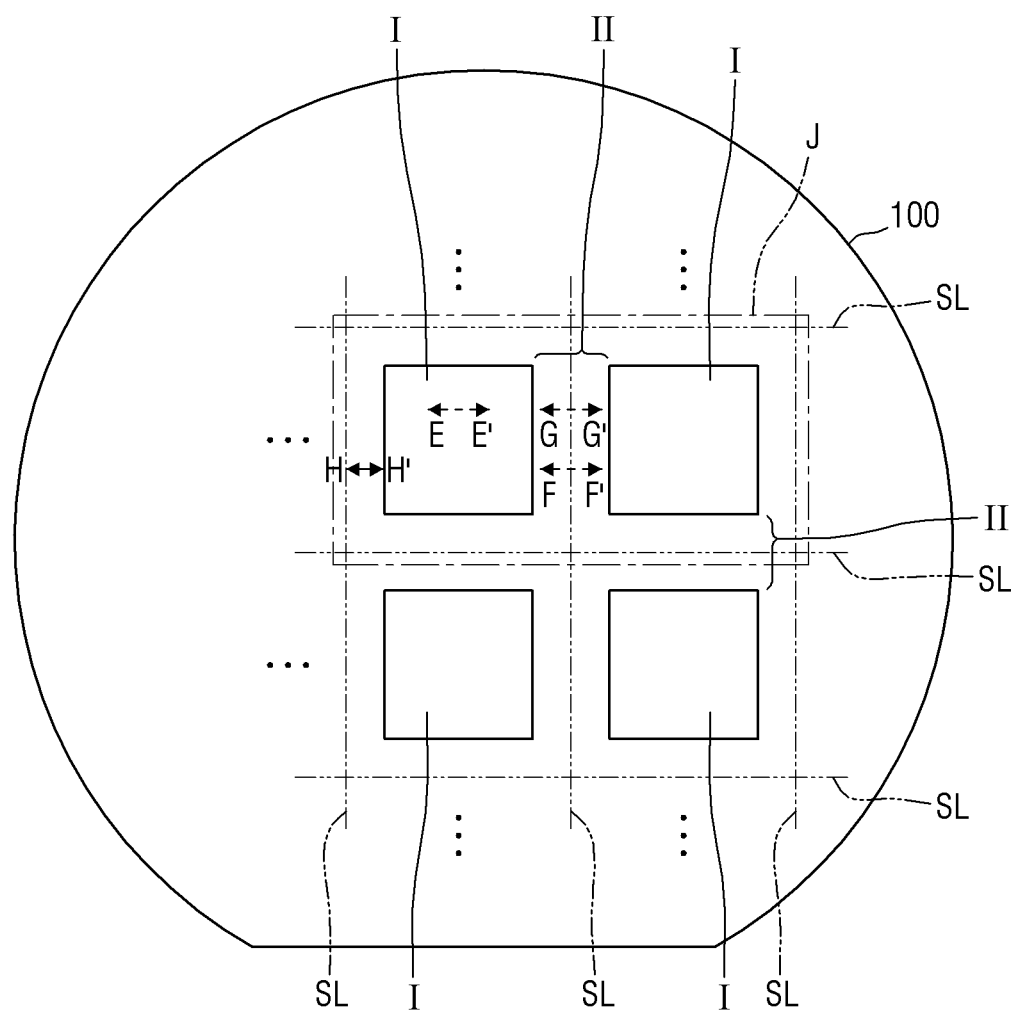
FIG. 9 is a diagram illustrating a substrate on which semiconductor devices according to some embodiments are integrated.

FIG. 9 is a diagram illustrating the substrate 100 on which the semiconductors device according to some embodiments are integrated. FIGS. 10 to 14 are intermediate process diagrams for explaining the method of fabricating the semiconductor device according to some embodiments. FIGS. 10 to 14 are cross-sectional views taken along lines E-E', F-F', G-G' and H-H' of FIG. 9.

Figure 10:
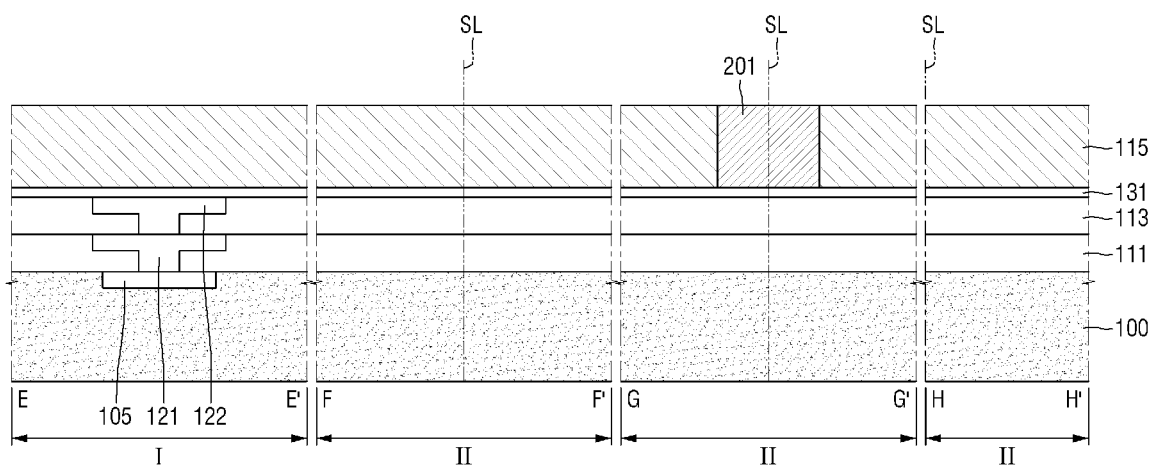
FIGS. 10 to 14 are intermediate process diagrams for explaining a method of fabricating a semiconductor device according to some embodiments.

Referring to FIGS. 9 and 10, the substrate 100 on which the semiconductor chip wiring 105 is formed may be provided. Further, the first insulating film 111, the second insulating film 113, the insertion film 131, and the third insulating film 115 may be sequentially stacked on the substrate 100. The first insulating film 111, the second insulating film 113, the insertion film 131, and the third insulating film 115 may be formed over the semiconductor chip region I and the scribe line region II.

A lower wiring structure 121 may be formed on the first insulating film 111. An upper wiring structure 122 may be formed in the second insulating film 113. The lower wiring structure 121 and the upper wiring structure 122 may be formed in the semiconductor chip region I.

A first alignment key 201 may be formed on the third insulating film 115. The first alignment key 201 may be formed in the scribe line region II.

Figure 11:
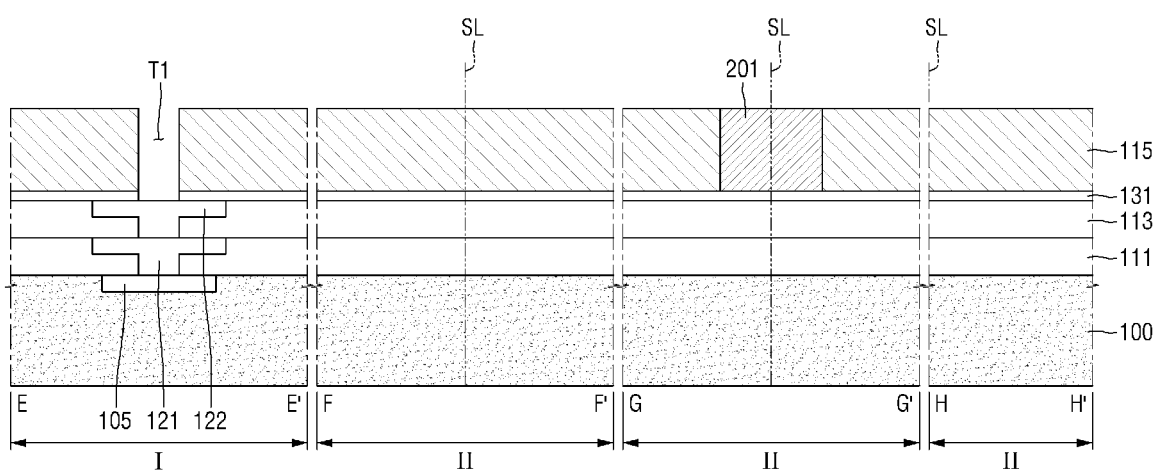

Referring to FIG. 11, a first trench T1 may be formed in the semiconductor chip region I. For example, a part of the third insulating film 115 formed in the semiconductor chip region I and a part of the insertion film 131 formed in the semiconductor chip region I may be removed. The upper wiring structure 122 may be exposed by the first trench T1.

Figure 12:
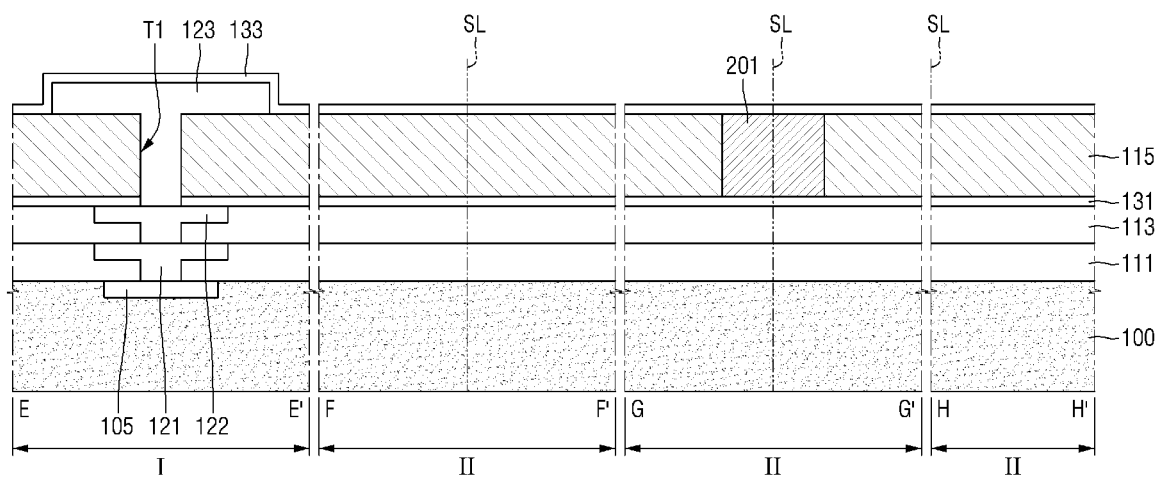

Referring to FIG. 12, a rewiring layer 123 and a protective film 133 may be formed.

The rewiring layer 123 may be formed to fill the first trench T1. Further, the rewiring layer 123 may also be formed on the upper surface of the third insulating film 115. The rewiring layer 123 may be formed in the semiconductor chip region I.

The protective film 133 may be formed on the third insulating film 115 to cover the rewiring layer 123. The protective film 133 may be formed over the semiconductor chip region I and the scribe line region II.

Figure 13:
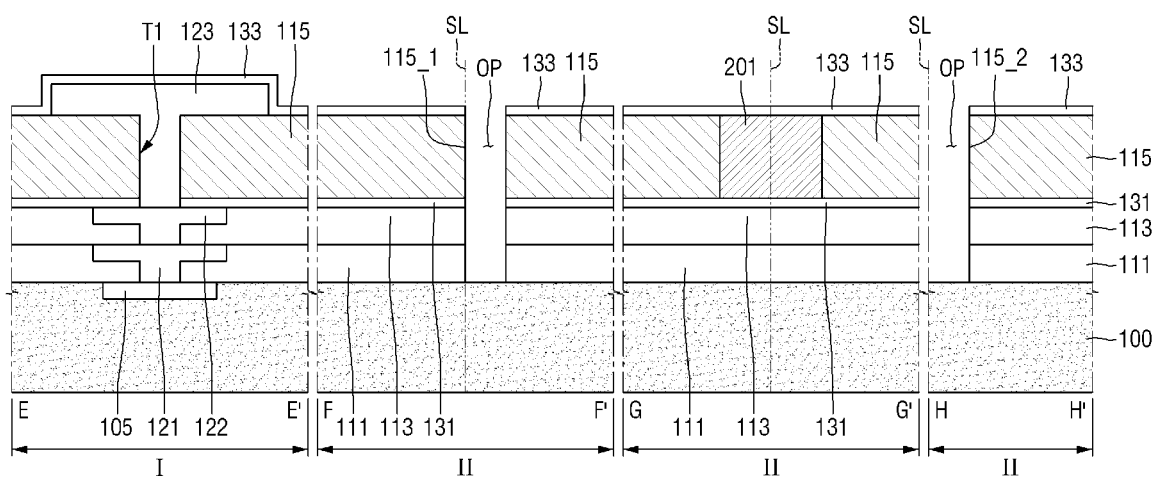

Referring to FIG. 13, an opening portion OP may be formed in the scribe line region II.

The opening portion OP may be formed by removing a part of the protective film 133 formed in the scribe line region II, a part of the third insulating film 115, a part of the insertion film 131, a part of the second insulating film 113 and a part of the first insulating film 111.

As the opening portion OP is formed, the first surface 115_1 of the third insulating film 115 may coincide with the cutting line SL. Also, the second surface 115_2 of the third insulating film 115 may be spaced apart from the cutting line SL.

The opening portion OP may be formed on one side of the cutting line SL.

Figure 14:
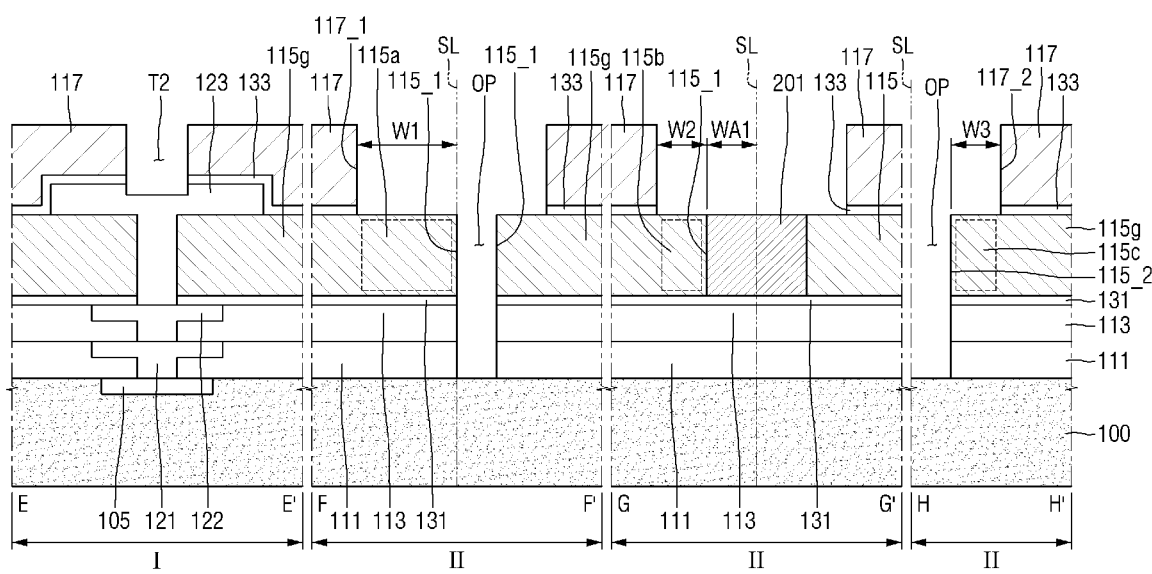

Referring to FIG. 14, the passivation film 117 may be formed on the protective film 133.

As the first distal end 117_1 of the passivation film 117 is located apart from the cutting line SL coinciding with the first surface 115_1 of the third insulating film 115 by a first width W1, a first portion 115a of the third insulating film 115 may be defined. As the first distal end 117_1 of the passivation film 117 is located apart from the first alignment key 201 by a second width W2, a second portion 115b of the second insulating film 115 may be defined.

As the second distal end 117_2 of the passivation film 117 is located apart from the second surface 115_2 of the third insulating film 115 by a third width W3, a third portion 115c of the second portion 115 may be defined.

The passivation film 117 may be formed to expose the first alignment key 201.

The protective film 133 on the first portion 115a of the third insulating film 115, the second portion 115b of the third insulating film 115, the third portion 115c of the third insulating film 115, and the alignment key 201 may be removed.

A part of the passivation film 117, a part of the protective film 133 and a part of the rewiring layer 123 formed in the semiconductor chip region I may be removed to form a second trench T2. The second trench T2 is formed in the passivation film 117 and the protective film 133 formed in the semiconductor chip region I and may extend into a part of the rewiring layer 123.

The second trench T2 may accommodate the connection terminal (101 of FIGS. 4 to 7) in a subsequent process.

Figure 15:
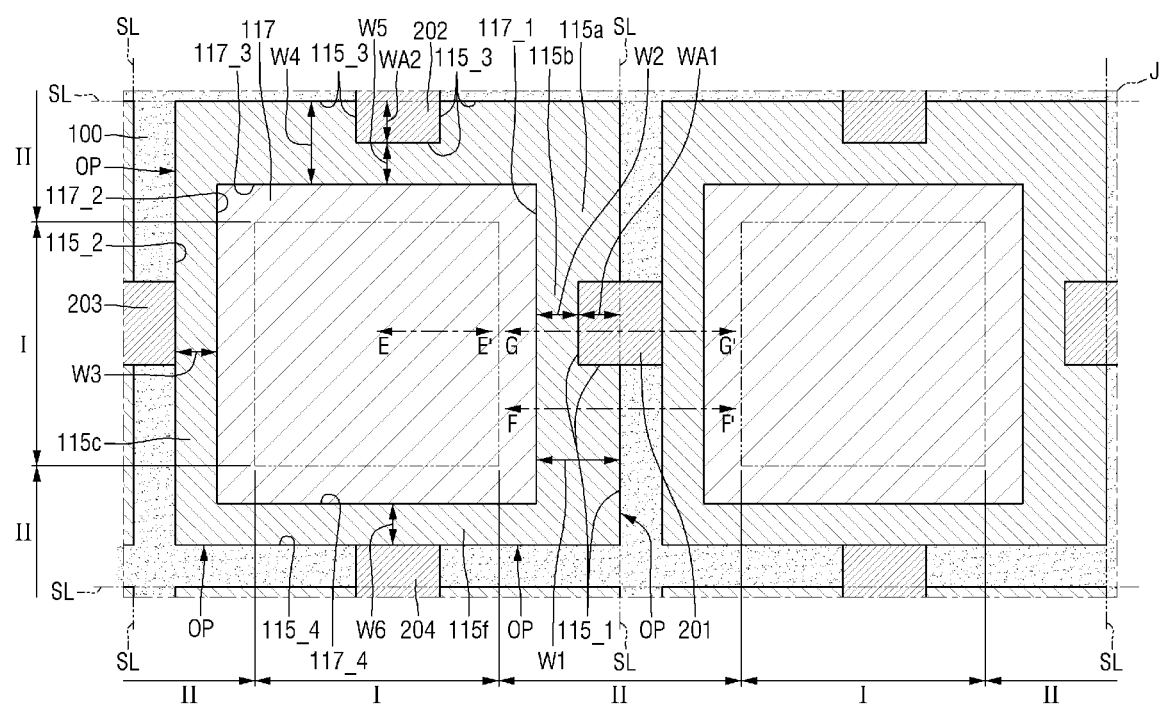
FIG. 15 is an enlarged view of a region J of FIG. 9 after the fabricating process of the semiconductor device up to FIG. 14 is performed.

FIG. 15 is an enlarged view of a region J of FIG. 9 after the fabricating process of the semiconductor device up to FIG. 14 is performed.

Referring to FIG. 15, the opening portion OP may be formed on the second surface 115_2 and the fourth surface 115_4 of the third insulating film 115. The opening portion OP may not be formed on the first surface 115_1 and the third surface 115_3 of the third insulating film 115. The opening portion OP may expose the third alignment key 203 and the fourth alignment key 204. The opening portion OP may expose the substrate 100.

The substrate 100 is cut along the cutting line SL, and the semiconductor device 1100 described with reference to FIGS. 3 to 7 may be formed.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the embodiments be considered in all respects as illustrative and not restrictive, reference being made to the appended claims rather than the foregoing description to indicate the scope of the invention.

What is claimed is:

1. A semiconductor device comprising:
   a substrate which comprises a semiconductor chip region and a scribe line region surrounding the semiconductor chip region;
   an insulating film arranged over the semiconductor chip region and the scribe line region on the substrate, and comprising a first surface, a second surface opposite to the first surface, a third surface connecting the first surface and the second surface, and a fourth surface opposite to the third surface and connecting the first surface and the second surface; and
   an opening portion formed on the second surface of the insulating film and the fourth surface of the insulating film to expose the substrate,
   wherein the opening portion is formed in the scribe line region, and
   wherein the first surface of the insulating film and the third surface of the insulating film do not comprise an opening portion which exposes the substrate.

2. The semiconductor device of claim 1, further comprising a passivation film arranged on the insulating film and arranged over the semiconductor chip region and the scribe line region,
   wherein the first surface of the insulating film is defined by:
      a first portion of the insulating film located in the scribe line region, protruding from the passivation film and having a first width; and
      a second portion of the insulating film located in the scribe line region, protruding from the passivation film and having a second width smaller than the first width, and
   wherein the second surface of the insulating film is defined by a third portion of the insulating film located in the scribe line region, protruding from the passivation film and having a third width smaller than the first width.

3. The semiconductor device of claim 2, wherein the third surface of the insulating film is defined by:
   a fourth portion of the insulating film located in the scribe line region, protruding from the passivation film and having a fourth width; and
   a fifth portion of the insulating film located in the scribe line region, protruding from the passivation film and having a fifth width smaller than the fourth width, and
   wherein the fourth surface of the insulating film is defined by a sixth portion of the insulating film located in the scribe line region, protruding from the passivation film and having a sixth width smaller than the fourth width.

4. The semiconductor device of claim 3, wherein the third width is smaller than the fourth width, and the sixth width is smaller than the first width.

5. The semiconductor device of claim 3, further comprising:
   a first alignment key arranged on the first surface of the insulating film; and
   a second alignment key arranged on the third surface of the insulating film,
   wherein a sum of the second width and a width of the first alignment key is the same as the first width, and
   wherein a sum of the fifth width and a width of the second alignment key is the same as the fourth width.

6. The semiconductor device of claim 2, further comprising an alignment key arranged on the first surface of the insulating film,
   wherein a sum of the second width and a width of the alignment key is the same as the first width.

7. A semiconductor device comprising:
   a substrate which comprises a semiconductor chip region and a scribe line region surrounding the semiconductor chip region;
   an insulating film arranged over the semiconductor chip region and the scribe line region on the substrate, and comprising a first surface, a second surface opposite to the first surface, a third surface connecting the first surface and the second surface, and a fourth surface opposite to the third surface and connecting the first surface and the second surface; and
   a passivation film arranged on the insulating film and arranged over the semiconductor chip region and the scribe line region,
   wherein the first surface of the insulating film is defined by:
      a first portion of the insulating film located in the scribe line region, protruding from the passivation film and having a first width; and
      a second portion of the insulating film located in the scribe line region, protruding from the passivation film and having a second width smaller than the first width, and
   wherein, the second surface of the insulating film is defined by a third portion of the insulating film located in the scribe line region, protruding from the passivation film and having a third width smaller than the first width.

8. The semiconductor device of claim 7, further comprising an opening portion formed in the second surface of the insulating film and the fourth surface of the insulating film to expose the substrate.

9. The semiconductor device of claim 8, wherein the opening portion is formed in the scribe line region, and
   wherein, the first surface of the insulating film and the third surface of the insulating film do not comprise an opening portion which exposes the substrate.

10. The semiconductor device of claim 7, wherein the third surface of the insulating film is defined by:
    a fourth portion of the insulating film located in the scribe line region, protruding from the passivation film and having a fourth width; and
    a fifth portion of the insulating film located in the scribe line region, protruding from the passivation film and having a fifth width smaller than the fourth width, and
    wherein the fourth surface of the insulating film is defined by a sixth portion of the insulating film located in the scribe line region, protruding from the passivation film and having a sixth width smaller than the fourth width.

11. The semiconductor device of claim 10, wherein the third width is smaller than the fourth width, and the sixth width is smaller than the first width.

12. The semiconductor device of claim 10, further comprising:
    a first alignment key arranged on the first surface of the insulating film; and
    a second alignment key arranged on the third surface of the insulating film,
    wherein a sum of the second width and a width of the first alignment key is the same as the first width, and
    wherein a sum of the fifth width and a width of the second alignment key is the same as the fourth width.

13. The semiconductor device of claim 7, wherein the first surface of the insulating film, the second surface of the insulating film, the third surface of the insulating film, and the fourth surface of the insulating film are located in the scribe line region.

14. The semiconductor device of claim 7, further comprising an alignment key arranged on the first surface of the insulating film,
wherein a sum of the second width and a width of the alignment key is the same as the first width.

15. The semiconductor device of claim 7, further comprising a rewiring layer which is at least partly arranged in the insulating film.

16. A semiconductor package comprising:
a semiconductor package substrate; and
the semiconductor device of claim 7 which is mounted on the semiconductor package substrate.

17. The semiconductor package of claim 16, wherein the third surface of the insulating film is defined by
a fourth portion located in the scribe line region, protruding from the passivation film and having a fourth width, and
a fifth portion of the insulating film located in the scribe line region, protruding from the passivation film and having a fifth width smaller than the fourth width, and
the fourth surface of the insulating film is defined by a sixth portion of the insulating film located in the scribe line region, protruding from the passivation film and having a sixth width smaller than the fourth width.

18. A semiconductor device comprising:
a substrate having four side surfaces;
a semiconductor chip formed on an upper surface of the substrate; and
an insulating film encompassing the semiconductor chip and having four side surfaces,
wherein, in a plan view of the semiconductor device, only two of the four side surfaces of the insulating film expose the upper surface of the substrate, and the other two of the four side surfaces of the insulating film are connected to two of the four side surfaces of the substrate, respectively, on a same plane.

19. The semiconductor device of claim 18, wherein the other two side surfaces of the insulating film are connected to each other.

20. The semiconductor device of claim 19, further comprising a passivation film formed on the insulation film and the semiconductor chip,
wherein, in the plan view of the semiconductor device, an area of the passivation film is smaller than an area of the insulating film.

* * * * *